United States Patent
Goto et al.

(10) Patent No.: US 6,282,214 B1
(45) Date of Patent: Aug. 28, 2001

(54) WAVELENGTH MULTIPLEXING LIGHT SOURCE

(75) Inventors: Ryosuke Goto; Kazuo Yamane, both of Kanagawa; Toshio Goto; Masakazu Mori, both of Aichi, all of (JP)

(73) Assignees: Fujitsu Limited, Kawasaki; Nagoya University, Aichi, both of (JP)

(*) Notice: Subject to any disclaimer, the term of this patent is extended or adjusted under 35 U.S.C. 154(b) by 0 days.

(21) Appl. No.: 09/262,331

(22) Filed: Mar. 4, 1999

(30) Foreign Application Priority Data

Sep. 17, 1998 (JP) .................................................. 10-263377

(51) Int. Cl.[7] ........................................................ H01S 3/10
(52) U.S. Cl. .................................. 372/20; 372/18; 372/43; 372/75; 372/97
(58) Field of Search ................................................. 372/20

(56) References Cited

U.S. PATENT DOCUMENTS 4,635,246 * 1/1987 Taylor ........................................ 370/3

OTHER PUBLICATIONS

Proceedings of the 1998 IEICE General Conference by the Institute of Electronics, Information and Communication Engineers, Mar. 6, 1998, Article C-4-37, p. 410 and a complete English language translation thereof.

Proceedings of the 1998 IEICE General Conference by the Institute of Electronics, Information and Communication Engineers, Mar. 6, 1998, Article C-4-60, p. 434 and a complete English language translation thereof.

* cited by examiner

Primary Examiner—Teresa M. Arroyo
Assistant Examiner—Gioacchino Inzirillo
(74) Attorney, Agent, or Firm—Staas & Halsey LLP (57) ABSTRACT

In a wavelength multiplexing light source used in an optical wavelength division multiplexing (WDM) transmission system and the like, at least three semiconductor lasers of single longitudinal mode have oscillation frequencies outside of their pull-in range at a normal injection locking without a modulation side band, an output light of a first semiconductor laser is injected in one way into a second semiconductor laser having an oscillation frequency adjacent to that of the first o semiconductor laser through a first one-way optical injection means to generate a modulation side band. The output light of the second semiconductor laser is then injected in one way into a third semiconductor laser having an oscillation frequency adjacent to that of the second semiconductor laser through a second one-way optical injection means to generate the modulation side band for an injection locking.

17 Claims, 13 Drawing Sheets

WAVELENGTH MULTIPLEXING LIGHT SOURCE

BACKGROUND OF THE INVENTION

1. Field of the Invention

The present invention relates to a wavelength multiplexing light source used in an optical wavelength division multiplexing (WDM) transmission system or the like.

In the existing final optical fiber communication system, a WDM transmission method by which a large capacity of information is put into a single optical fiber for the transmission has become mainstream.

Figure 12:
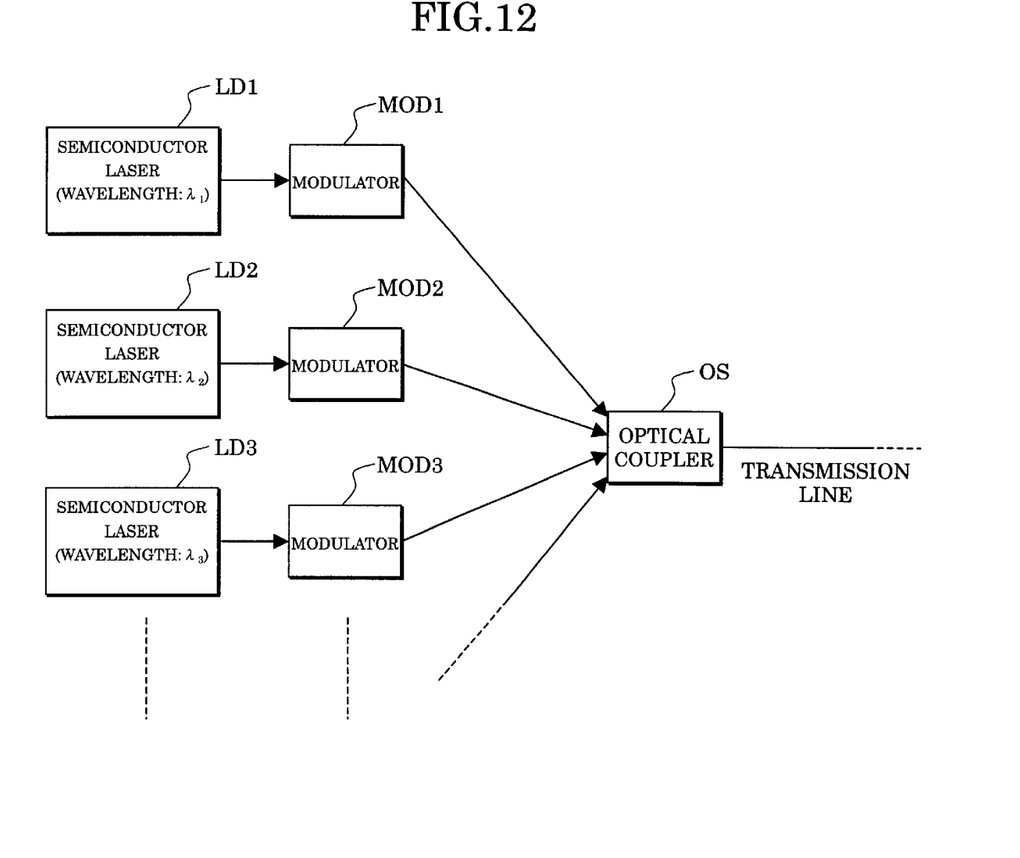
FIG. 12 is a schematic block diagram of a general wavelength multiplexing transmission method.

This is achieved by a wavelength multiplexing light source which realizes a large capacity of optical transmission, as shown in FIG. 12, by carrying information on laser lights respectively having different wavelengths $\lambda_1$, $\lambda_2$, $\lambda_3$, ... etc. and outputted from semiconductor lasers LD1, LD2, LD3, ... etc. as light sources for modulators MOD1, MOD2, MOD3, ... etc., and by coupling the laser lights at an optical coupler OS. Accordingly, without forcibly increasing a modulation rate (bit rate: b/s) of each of the light sources (channels) LD1, LD2, LD3, ... etc., a large capacity of transmission (several hundred gigabits/second) can be realized comparatively easily.

On the other hand, in an advanced informationalized society, there is no limits in a demand for an enlargement of capacity and therefore it is the present situation that makers all over the world have been competing desperately for the developments. In order to realize a further enlargement of capacity by e.g. the WDM method, it is necessary only to increase the number of wavelength (channel) to be transmitted. For this reason, such an idea can be hit that as many wavelengths as possible are transmitted by narrowing a wavelength interval between the light sources.

However, in the existing optical fiber communication system, an Er-doped optical fiber amplifier having an amplification band in a wavelength of 1.55 $\mu$m has been put into practice, to which band all optical signals have to be confined. Accordingly, it is required to narrow the wavelength interval of each light source and arrange the same in a high density within the wavelength band of 1.55 $\mu$m.

Presently, the wavelength interval standardized by the International Telecommunication Union is 100 GHz ($\approx$0.8nm) in frequency, and is scheduled to be narrowed up to 50GHz. This is only 0.03% of the oscillation frequency (1.55 $\mu$m $\approx$193.55THz) of a semiconductor laser as a light source, requiring an oscillation wavelength (frequency) control with an extremely high stability.

2. Description of the Related Art

Figure 13:
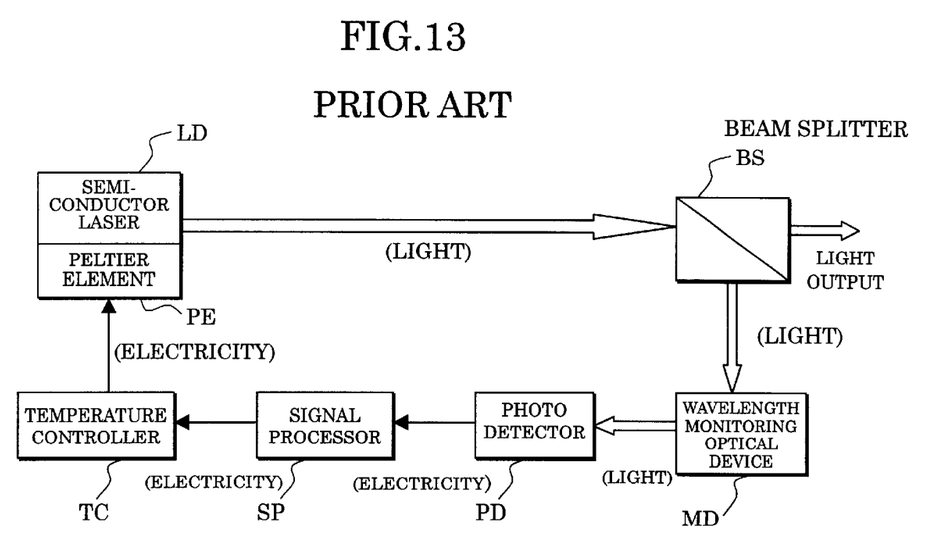
FIG. 13 is a block diagram showing a conventional wavelength controller.

To control such an oscillation wavelength, a conventional stabilization has been attempted under a temperature control of a light source and an injection current control. A general arrangement for such a stabilization is shown in FIG. 13. A part of the output light of a semiconductor laser LD is divided by a beam splitter BS, and its oscillation wavelength is monitored by an optical device MD. After the oscillation wavelength is converted into an electrical signal by a photo detector PD and an electrical signal processing is then performed to a deviation from a reference wavelength at a signal processor SP, current generated by a Peltie element PE combined with the semiconductor laser LD is fed back and controlled by a temperature controller TC.

The control accuracy for the oscillation wavelength by such a wavelength controller depends on; (1) the stability of the device which monitors the oscillation wavelength; (2) the accuracy of the electrical signal processing; and (3) the stability of the temperature controller. Furthermore, these controls are required to be executed per each light source. If such a high density wavelength multiplexing art is further advanced in the future, the number of the wavelength controller has to be increased accordingly and the control accuracy has to be improved, a very difficult situation being expected.

SUMMARY OF THE INVENTION

It is accordingly an object of the present invention to provide a light source which enables a wavelength multiplexing without enhancing the number of a wavelength controller and a control accuracy.

Figure 14A:
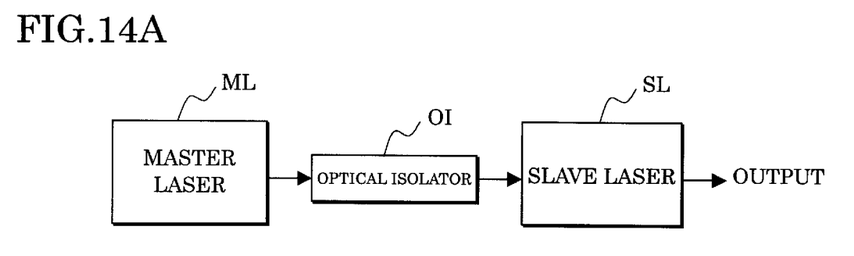
FIGS. 14A–14C are schematic diagrams showing a general injection locking.
Figure 14B:
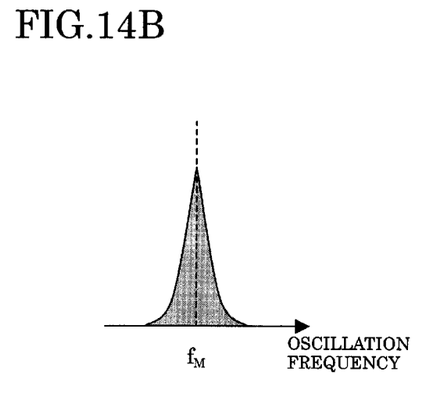
Figure 14C:
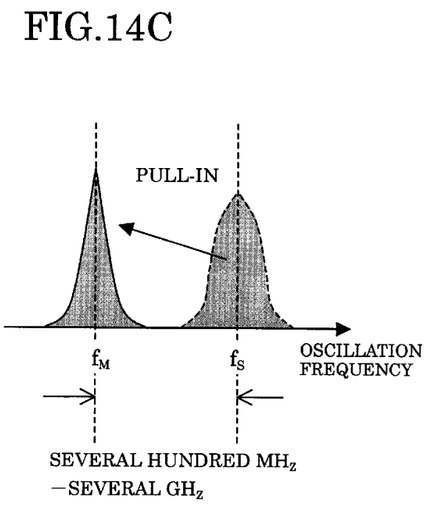

As a method for controlling an oscillation wavelength (frequency) of a semiconductor laser, a phenomenon which is generally called an "injection locking" is known. This method is based on that a coherent light is injected into the semiconductor laser from the outside thereof to lock the oscillation wavelength of the laser. A general arrangement of such an injection locking is shown in FIG. 14.

Namely, an output light from a semiconductor laser (master laser: oscillation frequency $f_M$) ML of single longitudinal mode whose narrow line width and oscillation frequency (wavelength) are stably controlled is injected into another semiconductor laser (slave laser: oscillation frequency $f_S$) SL of the same mode having the oscillation wavelength adjacent to that of the master laser through an optical isolator OI. As a result, an oscillation frequency of the slave laser SL is pulled in that of the master laser ML, thereby stabilizing the oscillation frequency, narrowing the line width, and suppressing the side mode if the slave laser SL lases in multi-longitudinal mode. It is to be noted that generally for the occurrence of the pull-in the oscillation frequencies of two lasers must be within a close range (within several hundred MHz-several GHz) which is called a "pull-in range".

In a wavelength multiplexing light source according to the present invention, it is paid attention to the fact that a modulation side band of an arbitrary frequency is generated in the master laser with the light injection, and that by pulling the oscillation frequency of the slave laser which is within the "pull-in range" of the side band component in the same side band these two lasers having an oscillation frequency interval ($|f_M-f_S|$) out of the "pull-in range" generate the injection locking.

Figure 1A:
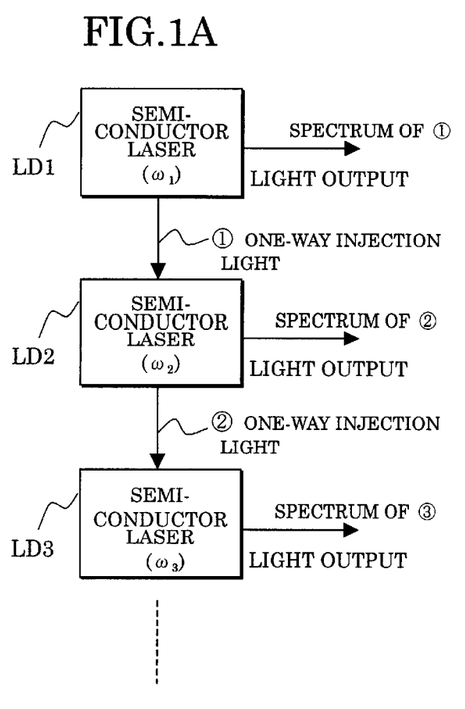
FIGS. 1A and 1B are diagrams showing an operation principle of a wavelength multiplexing light source according to the present invention.

Hereinafter, the principle (claim 1) of the present invention will be described referring to FIG. 1. As shown in FIG. 1A, at least three semiconductor lasers LD1–LD3 oscillated in the single longitudinal mode are used as light sources. An output light $\hat{1}$ of a first semiconductor laser LD1 (oscillation frequency:$\omega_1$) as an injection laser is injected in one way into an active layer of a second semiconductor laser LD2 (oscillation frequency:$\omega_2$) as the master laser through a first one-way optical injection means.

Figure 1B:
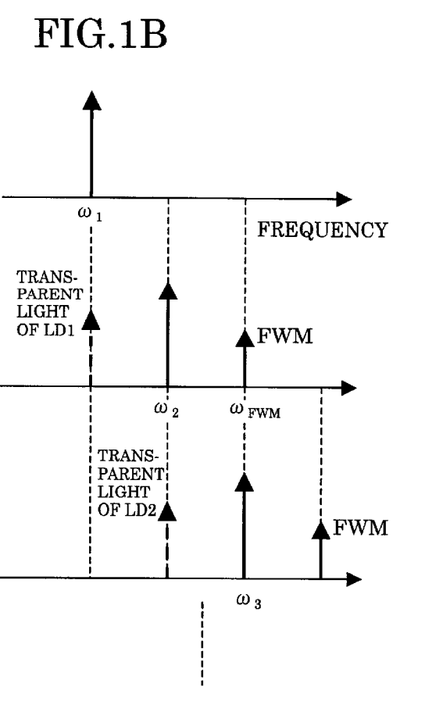

At this time, because of a non-linear characteristic in the semiconductor laser LD2, as shown in FIG. 1B, a light whose frequency is $\omega_{FWM}=2\omega_2-\omega_1$ which corresponds to the modulation side band of the semiconductor laser LD2 is generated. This phenomenon is generally known as a Four Wave Mixing (hereinafter abbreviated as FWM), and can be easily generated in a wide range whose frequency interval $|\omega_2-\omega_1|$ is from several GHz to several THz.

Next, an output light $\hat{2}$ of the semiconductor laser LD2 is injected in one way into a third semiconductor laser LD3 (oscillation frequency:$\omega_3$) as the slave laser through a second one-way optical injection means. At this time, if the difference between the frequencies ω3 and ωFWM is within the pull-in range of not much more than several GHz, the injection locking takes place so that as shown in the spectrum of the injection light $\hat{2}$, the frequency ω3 is pulled in the frequency ωFWM. Accordingly, the oscillation frequency of each semiconductor laser can be isolated out of the "pull-in range" at a normal injection locking without the modulation side band.

As a result, the oscillation frequency difference (ω3−ω2)= (ωFWM−ω2) between the semiconductor laser LD3 and the semiconductor laser LD2 is equal to the frequency interval (ω2−ω1) as shown in the spectrum of an injection light $\hat{3}$. Accordingly, if only the oscillation frequencies of the semiconductor lasers LD1 and LD2 are controlled to lock the frequency interval (ω2−ω1), the third semiconductor laser LD3 is also locked with the frequency interval (ω2−ω1).

Figure 2A:
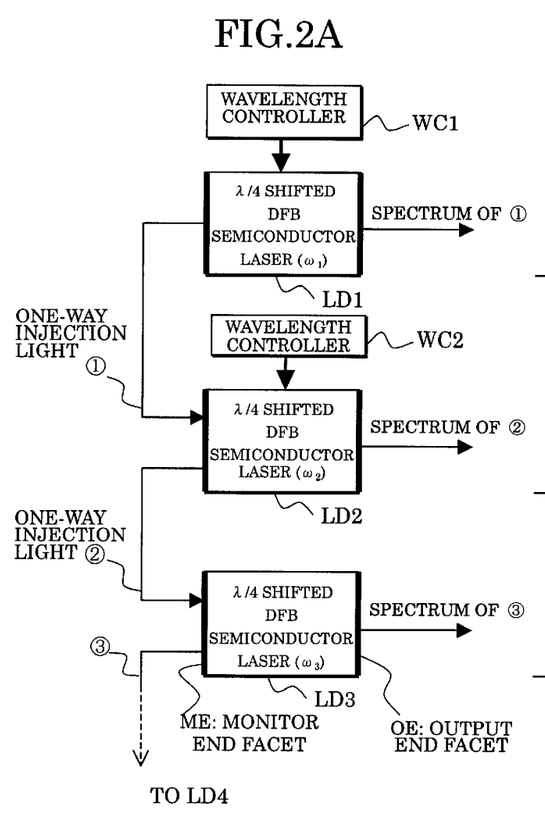
FIGS. 2A and 2B are diagrams showing an arrangement using a λ/4 shifted DFB (Distributed Feed Back) semiconductor laser in a wavelength multiplexing light source according to the present invention.
Figure 2B:
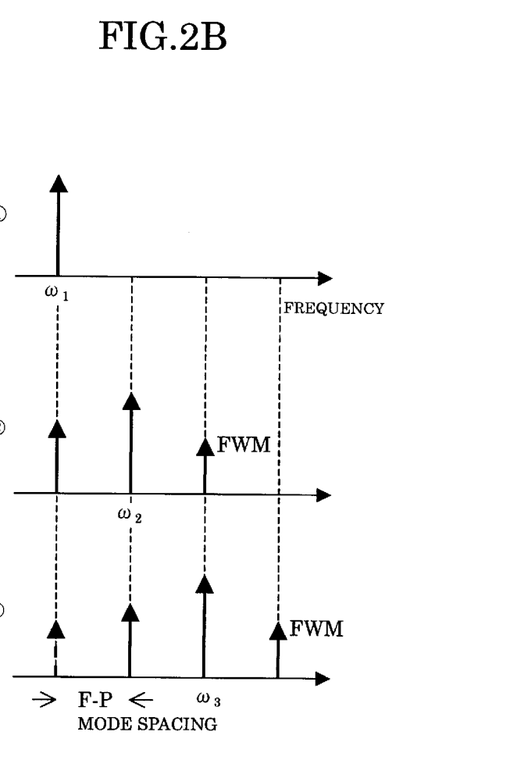

Furthermore, if semiconductor lasers LD4, LD5 . . . etc. are connected in the same arrangement (see FIG. 2), it becomes possible to fix the oscillation frequencies of all semiconductor laser light sources to that frequency interval (ω2−ω1) without any wavelength controllers but controllers WC1 and WC2 (see FIG. 2).

As mentioned above, if the present invention is applied for the wavelength (frequency) control of a multi-wavelength light source, it becomes possible to stabilize the oscillation wavelengths of all light sources with only the wavelength control for two semiconductor laser light sources however the number of semiconductor laser light source increases and however narrower the wavelength interval becomes.

BRIEF DESCRIPTION OF THE DRAWINGS

Throughout the figures, like reference numerals indicate like or corresponding components.

DESCRIPTION OF THE EMBODIMENTS

In the above-mentioned description, it has been supposed that a frequency interval of a light source can be set arbitrarily. However, this is limited to the case where a peak power of generated FWM (Four Wave Mixing) components is enough for the injection locking. Actually, if the frequency interval is more than several ten GHz, there is a tendency that the FWM generation efficiency falls since the generation mechanism changes so that the injection locking becomes difficult to take place.

Therefore, in order to raise the FWM generation efficiency, an arrangement using Fabry-Perot (F-P) mode spacing of a semiconductor laser will be described as follows:

FIG. 2 shows an arrangement using a λ/4 shifted DFB (Distributed FeedBack) semiconductor laser as a light source. The output light of the first semiconductor laser LD1 (oscillation frequency:ω1) is injected in one way into the semiconductor laser LD2 (oscillation frequency:ω2) through the first one-way optical injection means.

At this time, if the oscillation frequency ω1 is made consistent with the F-P side mode of the semiconductor laser LD2 to be injected, a phase condition at the time when the confined light shuttles in a resonator portion of the semiconductor laser LD2 is satisfied, and the confinement degree inside the resonator is enhanced.

As a result, the interaction of two lights works strongly and the FWM components with comparatively high efficiency are generated. Moreover, in the λ/4 shifted DFB semiconductor laser, the FWM components to be generated are made consistent with the F-P side mode since the F-P side mode exists in the symmetry position around the oscillation frequency (for instance ω2), as shown in the spectrum of the injection light $\hat{2}$. Accordingly, an amplifying action is provided in the semiconductor laser resonator, resulting in an enhanced generation efficiency. The injection light $\hat{2}$ is given in the same way to the semiconductor laser LD3 from the semiconductor laser LD2.

If the λ/4 shifted DFB semiconductor laser of the same structure is used for all semiconductor laser light sources and besides the oscillation wavelengths (frequencies) of the semiconductor lasers LD1 and LD2 are controlled by using the prior art wavelength controllers WC1 and WC2, the wavelengths of all semiconductor laser light sources can be fixed to the frequency interval accorded with the F-P mode spacing: (Claims 2, 3)

It is to be noted that the wavelength controllers WC1 and WC2 are thus provided for the semiconductor lasers LD1 and LD2 in the following description.

Figure 3A:
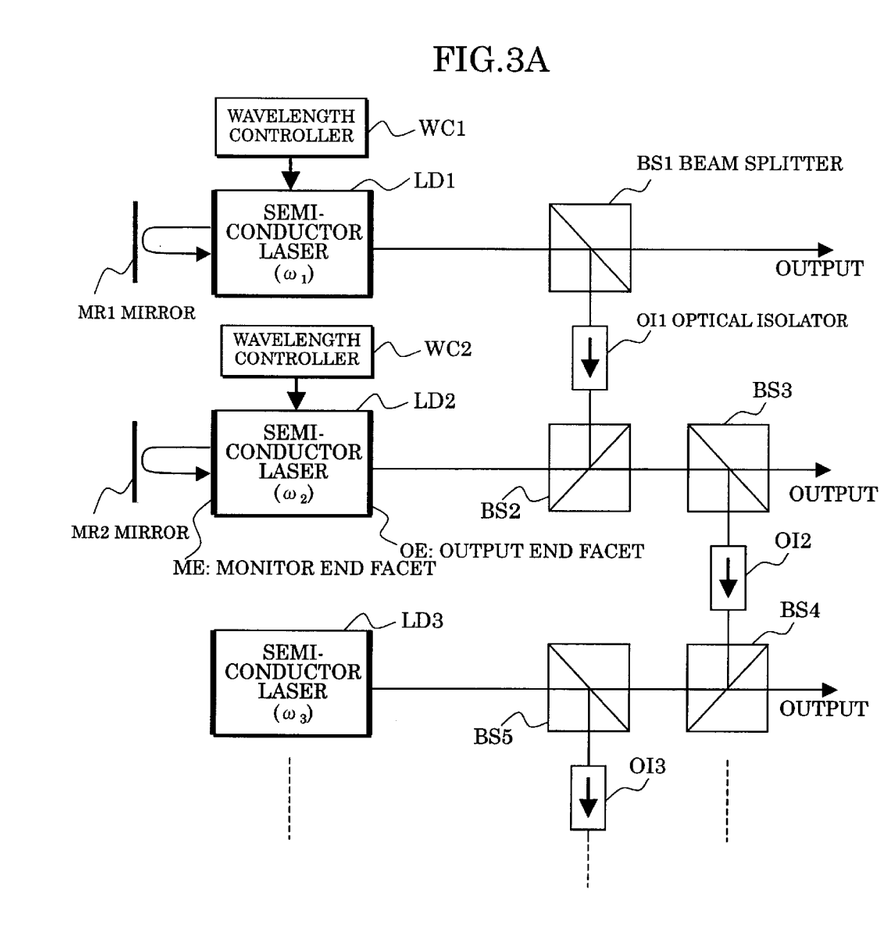
FIGS. 3A and 3B are diagrams showing an arrangement of collectively narrowing a line width in a wavelength multiplexing light source according to the present invention.
Figure 3B:
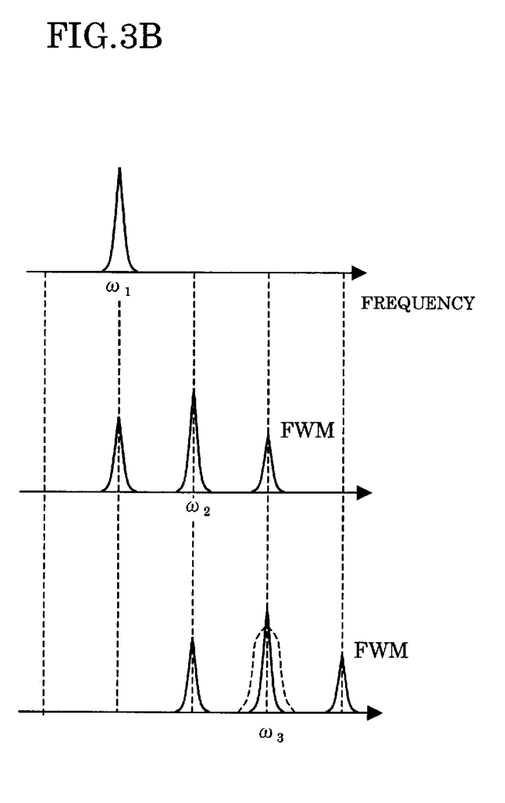

FIG. 3 illustrates an arrangement in which the oscillation line width of each semiconductor laser light source is narrowed collectively. In this case, mirrors MR1 and MR2 as external resonators are respectively added to monitor end faces of the semiconductor lasers LD1 and LD2 to narrow the oscillation line widths of the semiconductor lasers LD1 and LD2.

A one-way optical injection is performed to the semiconductor laser LD2 through a beam splitter BS1, an optical isolator OI1, and a beam splitter BS2 which form the first one-way optical injection means by using the output light of the semiconductor laser LD1. The next one-way optical injection is performed to the semiconductor laser LD3 through a beam splitter BS3, an optical isolator OI2, and a beam splitter BS4 which form the second one-way optical injection means by using the output light of the semiconductor laser LD2.

As a result, since the generated four wave mixing is narrowed the line width of the semiconductor laser LD3 pulled in the frequency components $\omega_1$ and $\omega_2$ is also narrowed.

Resultantly, four wave mixing components by means of the semiconductor lasers LD2 and LD3 are also narrowed, so that the line width of the semiconductor laser LD4 (not shown) is also narrowed in order.

Accordingly, it becomes possible to decrease a crosstalk by narrowing the line width of each semiconductor laser in this way. In addition, when the wavelength interval (channel spacing) is required to be further narrowed with the advance of the WDM method, narrowing the line width becomes useful.

By the same principle, as long as the line width of the four wave mixing components which is the injection light is narrower than that of the light source to be injected, the line widths of all semiconductor laser light sources can be narrowed: (Claims 4, 5, and 6)

Figure 4A:
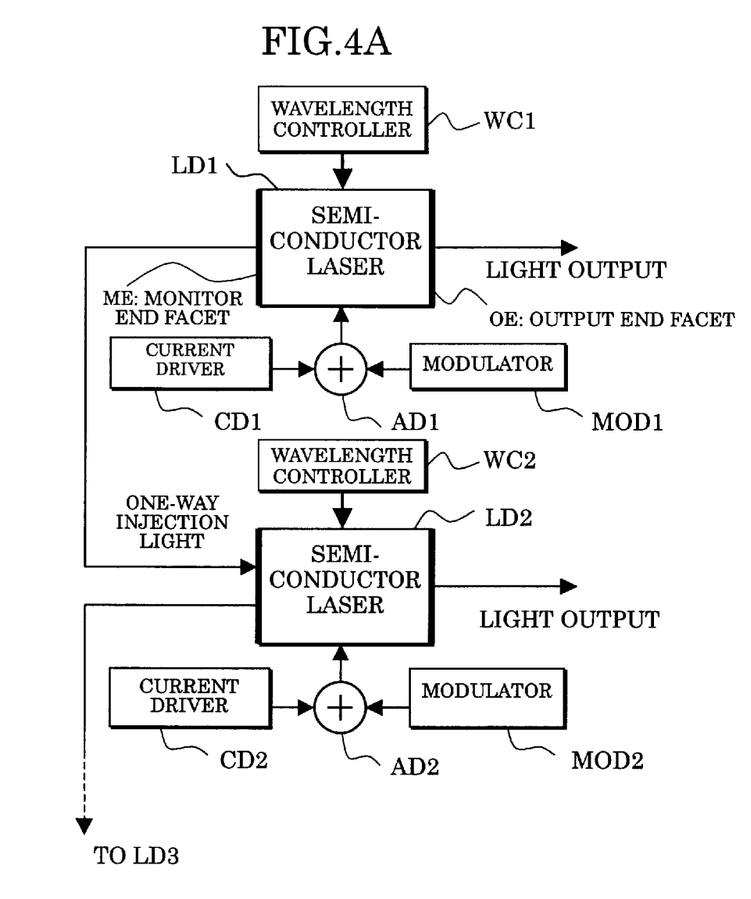
FIGS. 4A and 4B are block diagrams showing an arrangement of collectively widening a line width in a wavelength multiplexing light source according to the present invention.
Figure 4B:
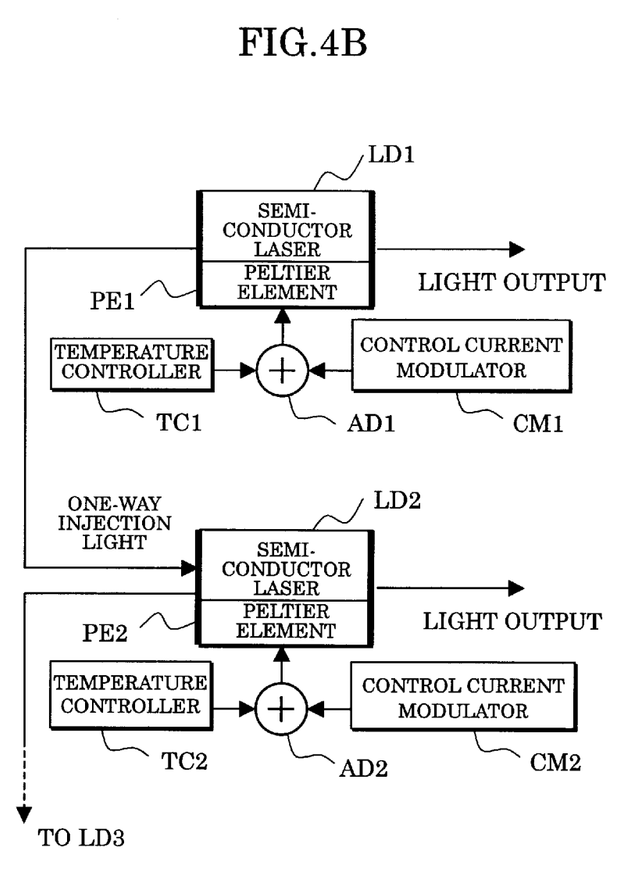

FIG. 4 shows an arrangement in which the line width of each semiconductor laser light source is intentionally extended, contrary to the arrangement in FIG. 3. Namely, with narrowing the line width of the light source as mentioned above, a stimulated Brillouin scattering (SBS) is generated which is an optical non-linear phenomenon. This is disadvantageous in that the light components propagated within the fiber are reflected. To avoid this, it may become necessary to widen the line width of the light source to the contrary.

FIG. 4A shows an arrangement in which injection current for the semiconductor laser LD1 or LD2 is modulated by using current drivers CD1, CD2, modulators MOD1, MOD2, and adders AD1, AD2 which add the output signal of both above circuits. FIG. 4B shows an arrangement in which a temperature is modulated by Peltier elements PE1, PE2 combined with the semiconductor lasers LD1, LD2 by using temperature controllers TC1, TC2, the control current modulators CM1, CM2, and adders AD1, AD2 which add the output signal of both above circuits.

In FIG. 4A, a frequency modulation is performed to the semiconductor laser LD1 or LD2 by changing (swinging) the injection current. By enlarging the modulation degree, the line width of the generated four wave mixing can be widened. As a result, the line width of the semiconductor laser LD3 connected to the semiconductor laser LD2 with the same relationship can also be widened. In the same principle, the line width of all semiconductor laser light sources can be widened at the same time. On the other hand, in FIG. 4B, if the temperature of the semiconductor laser LD1 or LD2 is modulated (swung), the oscillation line width can be widened by the oscillation frequency-temperature dependency (characteristic) of the semiconductor laser. As a result, if the temperature modulation degree is enlarged, the line width of the semiconductor laser LD3 connected to the semiconductor laser LD2 with the same relationship can also be widened. In the same principle, the line width of all semiconductor laser light sources can be widened at the same time.

Moreover, in FIG. 4A, the output power of the semiconductor laser is fluctuated at the same time because the injection current is modulated, while in FIG. 4B the control of line width can be performed without changing the output power because the injection current is constant:(Claims 7, 8, and 9)

Figure 5A:
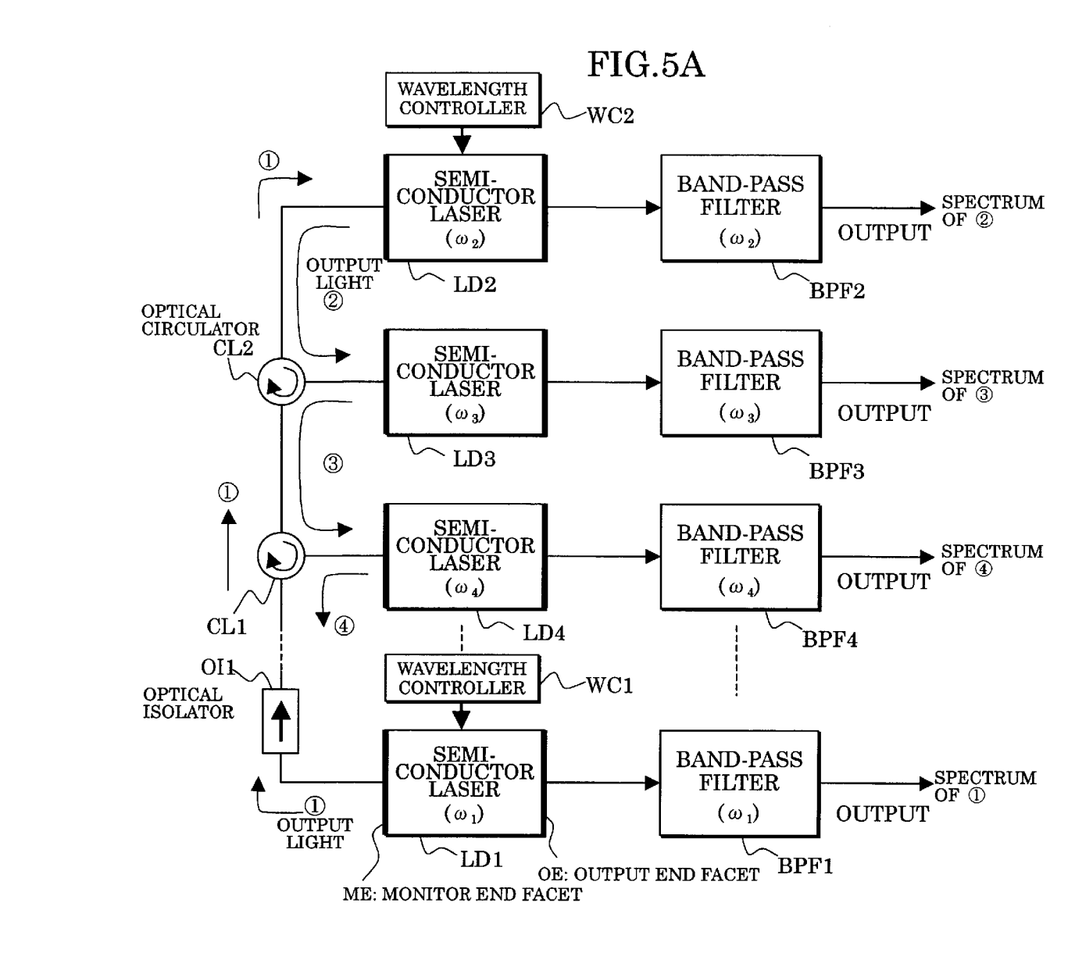
FIGS. 5A and 5B are diagrams showing an arrangement which uses an optical circulator as a one-way optical injection means in a wavelength multiplexing light source according to the present invention.
Figure 5B:
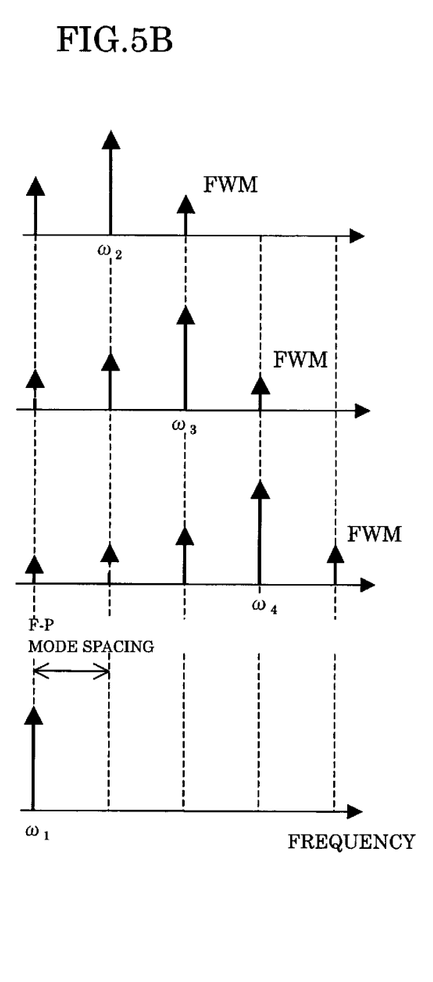

FIG. 5 shows an arrangement of the one-way optical injection by using an optical circulator. In this arrangement, the first one-way optical injection means comprises an optical isolator OI1, and the second oneway optical injection means comprises optical circulators CL1 and CL2.

The output light $\hat{1}$ from the monitor end facet ME of the semiconductor laser LD1 passes through the optical isolator OI1, and is not injected into the semiconductors LD3, LD4 . . . etc. but only into the semiconductor laser LD2 through a plurality of optical circulators CL1, CL2 . . . etc. The output light $\hat{2}$ from the monitor end facet ME of the semiconductor laser LD2 is not injected into the semiconductor laser LD4 but into the semiconductor laser LD3 through the optical circulator CL2. The same operations apply to the output lights $\hat{3}$ and $\hat{4}$.

If the light from each output end facet OE of each of the semiconductor lasers LD1–LD4 is passed through optical band-pass filters BPF1–BPF4, and an extra component such as an FWM is removed, a stable multi-wavelength light source can be obtained: (Claim 10)

It is to be noted that the following arrangements use the optical band-pass filter for the output light of each semiconductor laser: (Claim 17)

Figure 6:
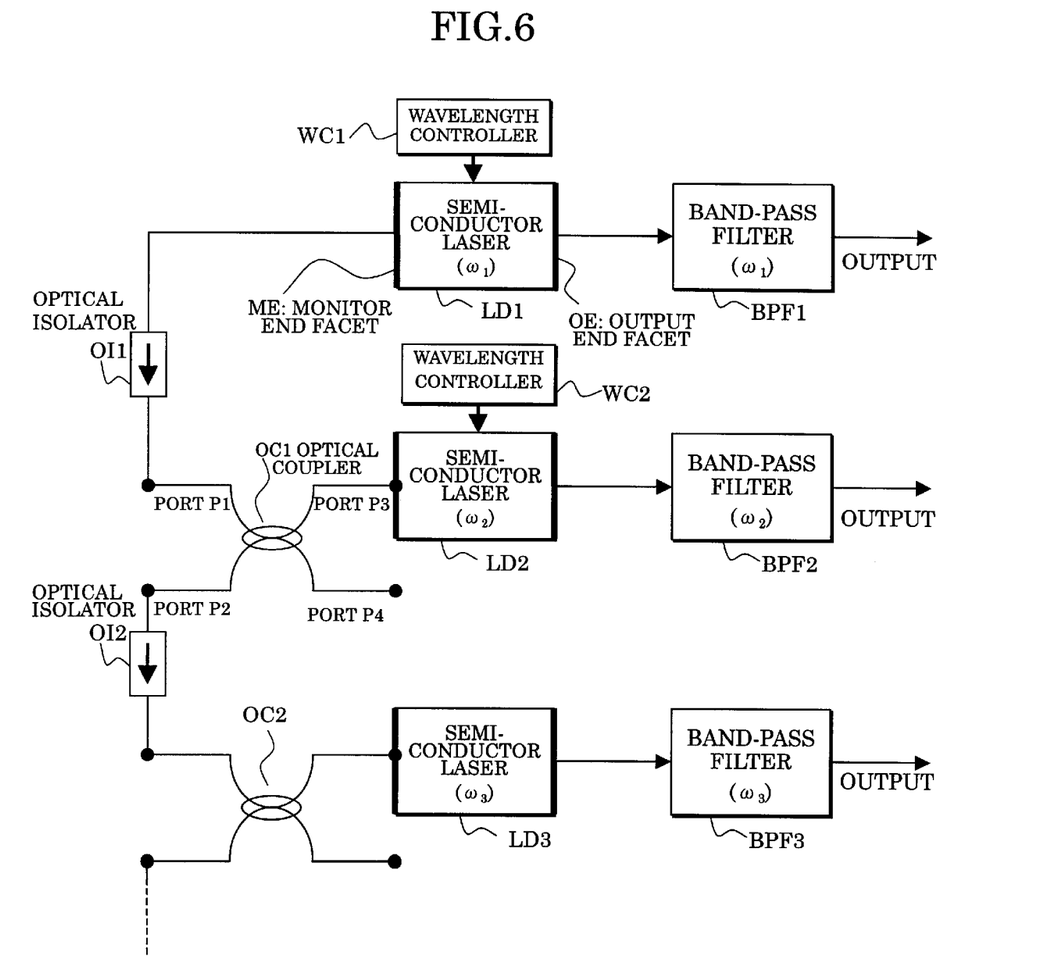
FIG. 6 is a diagram showing an arrangement of an optical coupler as a one-way optical injection means in a wavelength multiplexing light source according to the present invention.

FIG. 6 shows an arrangement of the one-way optical injection by using an optical separator such as an optical coupler. In this case, the first and the second one-way optical injection means comprise the optical isolators OI1, OI2, and optical couplers OC1, OC2, respectively.

The output light from the monitor end facet ME of the semiconductor laser LD1 is passed through the optical isolator OI1 and injected into the semiconductor laser LD2 through ports P1 and P3 of the optical coupler OC1. The output light from the monitor end facet ME of the semiconductor laser LD2 passes through the port P3 and a port P2 of the optical coupler OC1 and injected into the semiconductor laser LD3 through the optical isolator OI2 and the optical coupler OC2. The same arrangements are supposed to be provided in the latter stage: (Claim 11)

When the above-mentioned arrangements are used, the semiconductor lasers in the latter stage will have accumulated oscillation spectrum components of the semiconductor lasers in the former stage. Namely, if the output light $\hat{2}$ of the semiconductor laser LD2 is inputted as it is into the semiconductor laser LD3 in the arrangement in FIG. 2, a residual component of the output light $\hat{1}$ of the semiconductor laser LD1 (the oscillation frequency: $\omega_1$) is also inputted to the same as shown by the dotted arrow line in the spectrum of $\hat{3}$. In addition, if the output light $\hat{3}$ of the semiconductor laser LD3 is inputted to the semiconductor laser LD4 (not shown), the residual components of the semiconductor lasers LD1 ($\omega_1$) and LD2 ($\omega_2$) are also inputted to the same.

Thus, the semiconductor lasers in the latter stages will have more residual components inputted from the semiconductor lasers in the former stages, so that the S/N and FWM generation efficiency will be degraded.

Figure 7A:
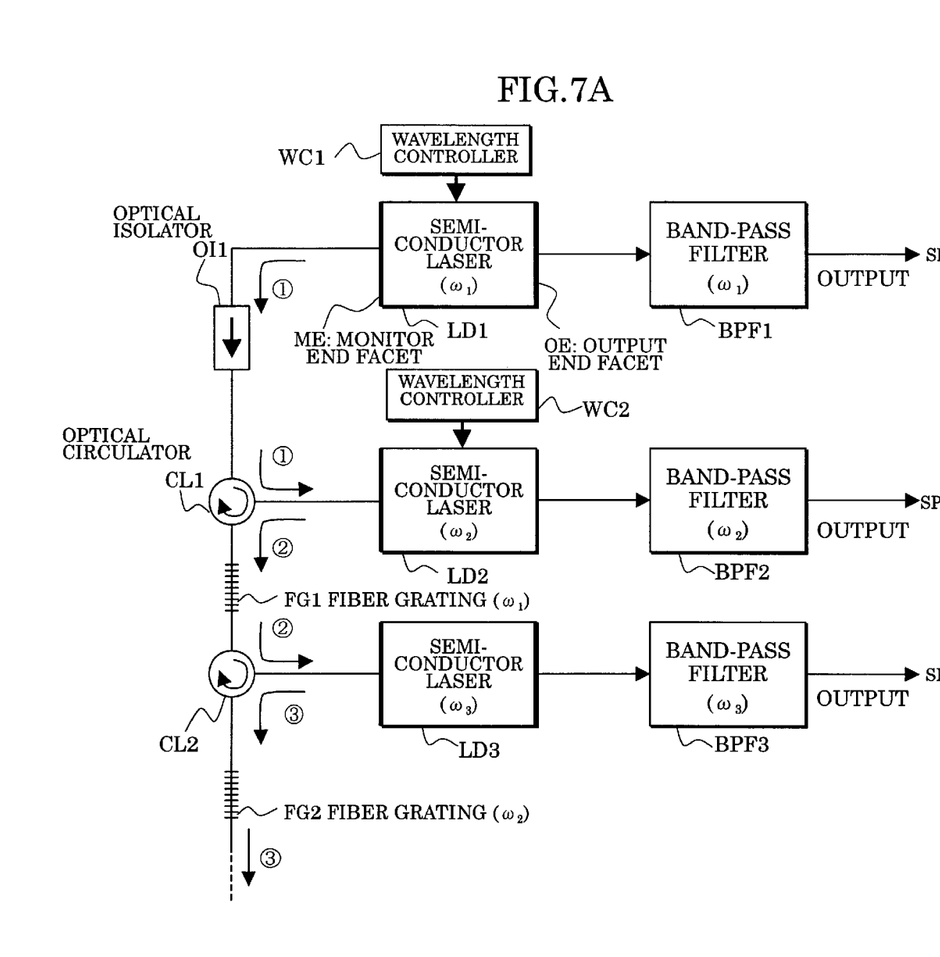
FIGS. 7A and 7B are diagrams showing an arrangement of a fiber granting as a one-way optical injection means in a wavelength multiplexing light source according to the present invention.
Figure 7B:
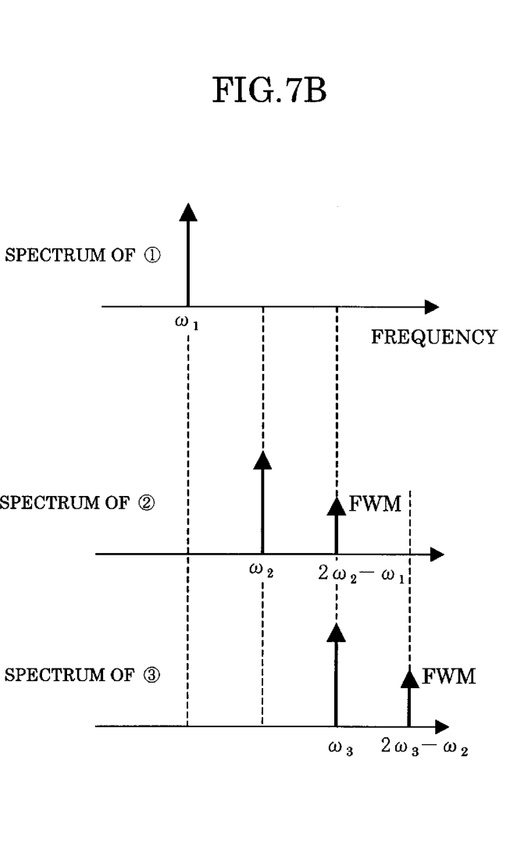

As a method for solving this problem, FIG. 7 shows an arrangement of the one-way optical injection by using a fiber grating.

In this case, the first one-way optical injection means comprises the optical isolator OI1, and the second one-way optical injection means comprises the optical circulators CL1, CL2 and fiber gratings FG1, FG2 for preventing the oscillation spectrum components generated before the Semi-conductor lasers in the preceding stages from being injected into the semiconductor lasers in the following stages.

The output light $\hat{1}$ from the monitor end facet ME of the semiconductor laser LD1 is injected into the semiconductor laser LD2 through the optical isolator OI1 and the optical circulator CL1. Then, the output light $\hat{2}$ from the monitor end facet ME of the semiconductor laser LD2 is injected into the semiconductor laser LD3 through the fiber grating FG1 of a Bragg wavelength $\lambda_1$ (the frequency $\omega_1$).

At this point, the component of the frequency $\omega_1$ is reflected and only the frequency components $\omega_2$ and ($2\omega_2-\omega_1$) (FWM) are injected. The reflected $\omega_1$ component is directed toward the semiconductor laser LD1 by the optical circulator CL1, which is, however, not injected into the semiconductor laser LD1 because of the attenuation in the optical isolator OI1.

By this arrangement used, all of such needless components can be reflected by the fiber gratings and can be attenuated by the optical isolators: (Claim 12)

Figure 8:
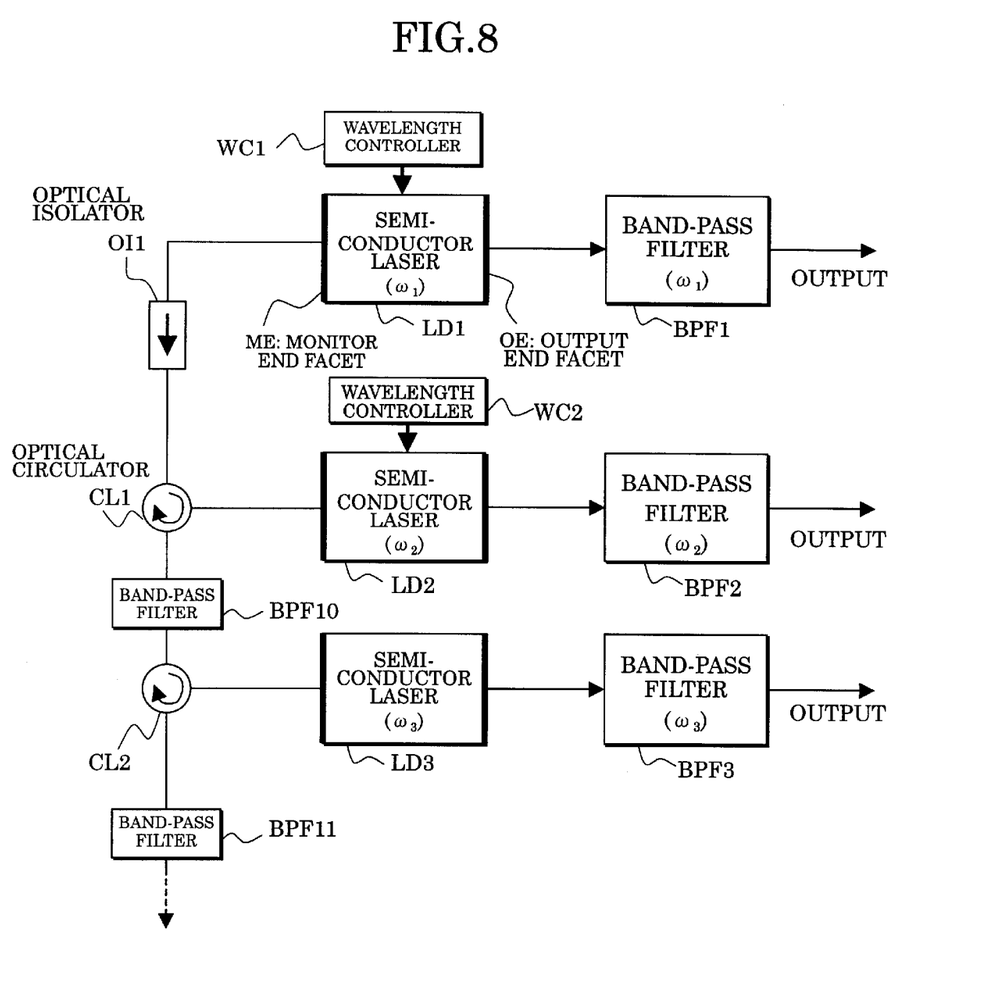
FIG. 8 is a block diagram showing an arrangement of an optical band-pass filter as a one-way optical injection means in a wavelength multiplexing light source according to the present invention.
Figure 9A:
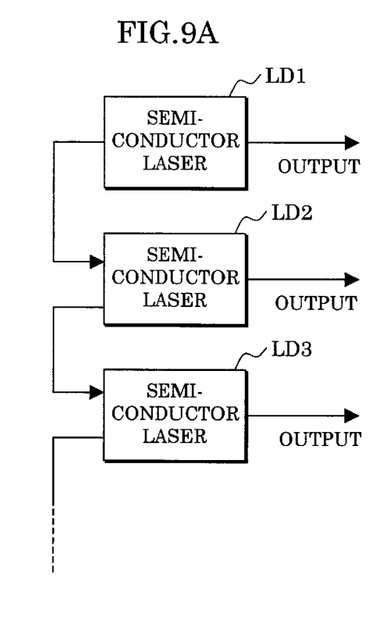
FIGS. 9A–9D are block diagrams showing a whole arrangement of a wavelength multiplexing light source according to the present invention.
Figure 9B:
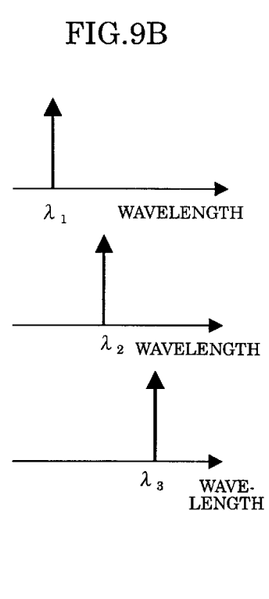
Figure 9C:
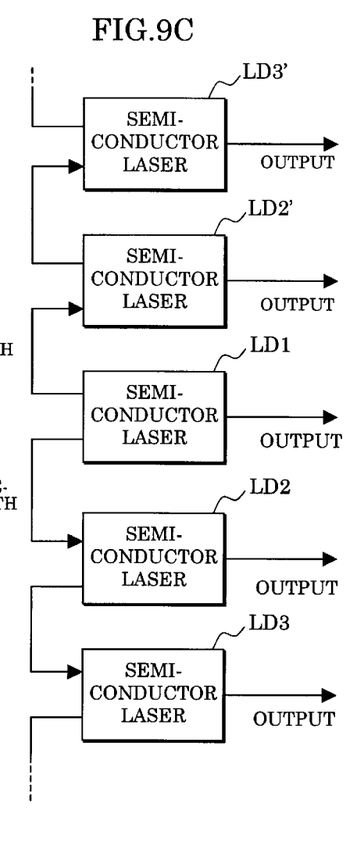
Figure 9D:
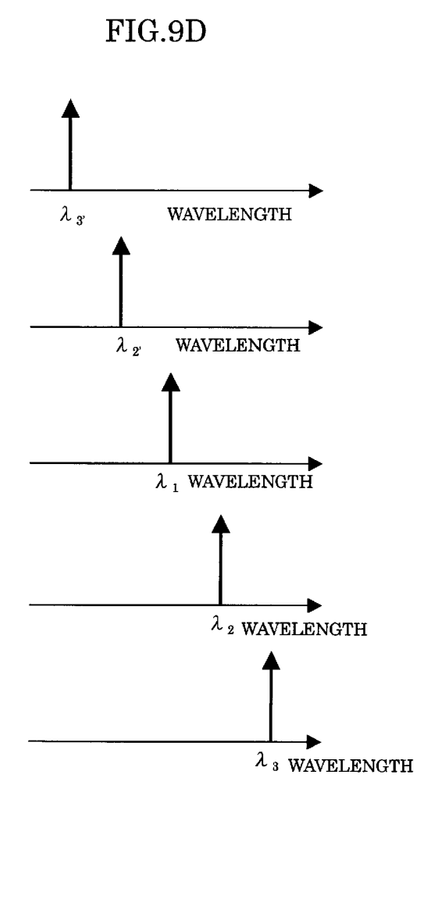

Meanwhile, FIG. 8 shows an arrangement using an optical filter instead of the above-mentioned fiber grating. Namely, as the second one-way optical injection means, optical band-pass filters BPF10 and BPF11 are substituted for the fiber gratings.

In this case, for example, the portion which injects the output light of the semiconductor laser LD2 into the semiconductor laser LD3 may use an optical filter which passes only the component of the semiconductor laser LD2 ($\omega_2$) and the FWM ($2\omega_2-\omega_1$): (Claim 13)

FIG. 9 shows a whole arrangement of a multi-wavelength light source which uses the present invention according to the above-mentioned arrangements. Particularly, FIG. 9A shows an arrangement in which the wavelength ($\lambda_1$) of the semiconductor laser LD1 is supposed to be either the shortest wavelength or the longest wavelength as shown in FIG. 9B and semiconductor lasers in the latter stage are connected in cascade. FIG. 9C shows an arrangement in which on the shorter and longer sides around the wavelength of the semiconductor laser LD1 as shown in FIG. 9D, semiconductor lasers in the latter stage are connected in cascade: (Claims 14, 15)

Figure 10:
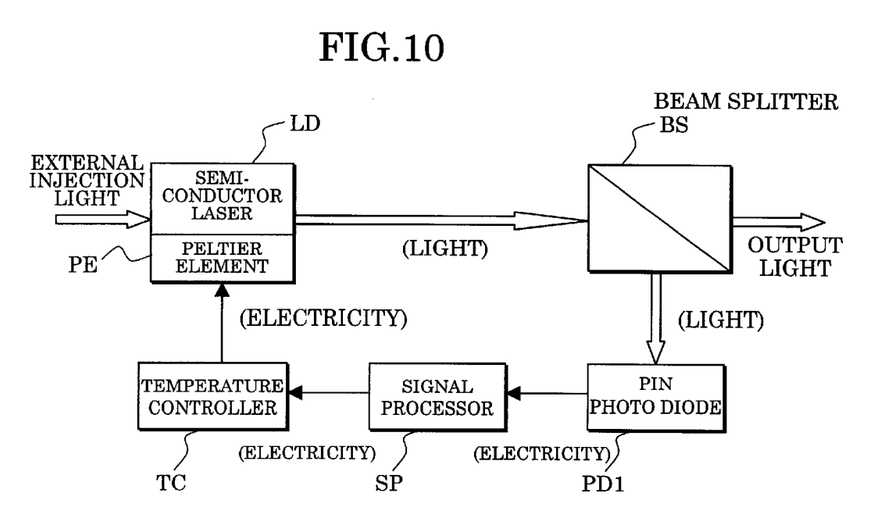
FIG. 10 is a block diagram showing an arrangement (1) of a wavelength controller used in a wavelength multiplexing light source according to the present invention.

FIG. 10 shows an arrangement (1) of the wavelength controller in the semiconductor laser light sources. In this arrangement, a PIN photo diode PD1 is substituted for the optical device MD and the photo detector PD in the prior art of FIG. 13.

Namely, when the temperature only of a specified semiconductor laser light source rises by a device fault or the like, there is a possibility that the injection locking fails. At this time, two kinds of components, i.e. the FWM component ($\omega_{FWM}$) externally injected and the laser oscillation component ($\omega_{LD}$) appear in the output light from the semiconductor laser light source.

The reason of the injection locking failure is that $|\omega_{FWM}-\omega_{LD}|$ has exceeded the lock range up to several GHz.

Accordingly, when this output light is divided by the beam splitter BS and detected with the PIN photo diode PD1 in such an arrangement as shown in FIG. 10, a beat signal of $\omega_b=|\omega_{FWM}-\omega_{LD}|$ is detected.

By using this signal to apply a feedback operation to the Peltier element PL through the temperature controller TC for the light source so that the beat frequency may fall, the output light is automatically pulled in a desired wavelength and is locked when the frequency $\omega_b$ becomes below the pull-in range. In this case, although the temperature control is performed, no complicated control is required since the wavelength has only to be swept in a fixed direction, either the longer wavelength side or the shorter wavelength side.

Figure 11:
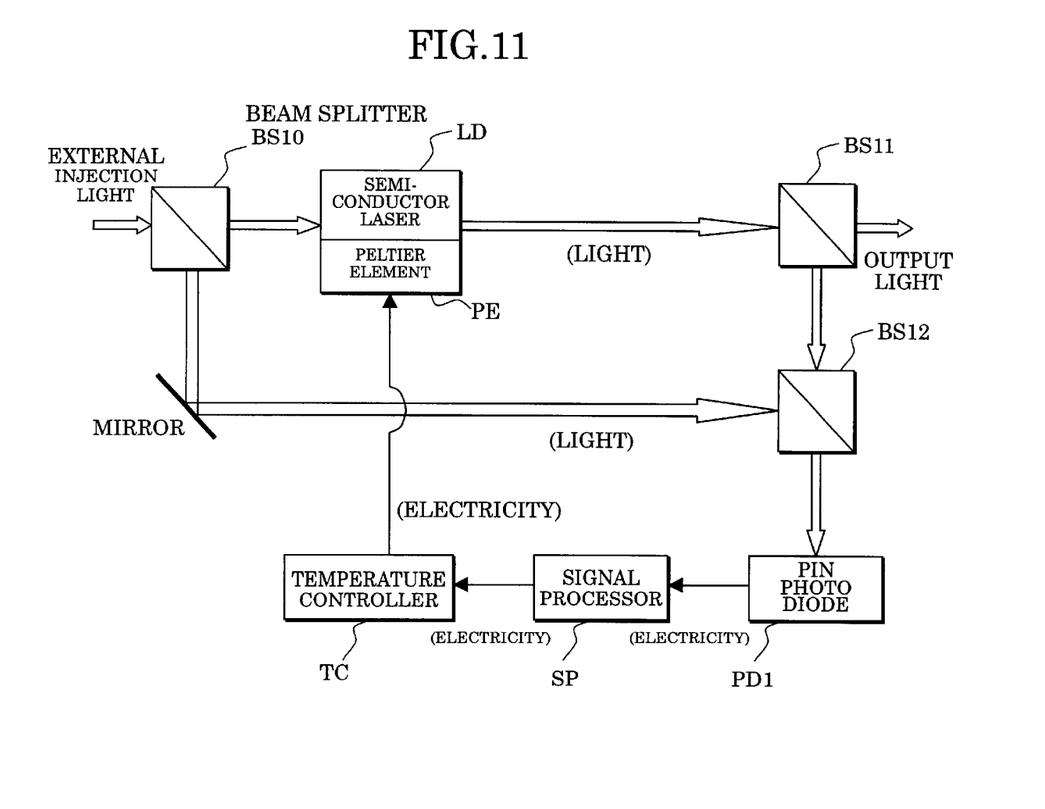
FIG. 11 is a block diagram showing an arrangement (2) of a wavelength controller used in a wavelength multiplexing light source according to the present invention.

In addition, as shown in FIG. 11, by using three beam splitters BS10–BS12 the light separated at the beam splitter BS 10 provided on the input side of the semiconductor laser LD can be combined, at the beam splitter BS12, with the output light of the semiconductor laser LD separated at the beam splitter BS 11 to be provided to the PIN photo diode PD1.

Namely, this arrangement uses a portion of an external injection light divided by the beam splitter BS10 to detect beat signal of same with the output light of the light source, so that the operation principle is the same as the arrangement in FIG. 10. As shown in FIG. 6, when the arrangement uses the optical coupler, the optical coupler may be substituted for the beam splitter BS 10 in FIG. 11: (Claim 16)

As described above, a wavelength multiplexing light source according to the present invention is arranged such that at least three semiconductor lasers of single longitudinal mode have oscillation frequencies outside of their pull-in range at a normal injection locking without a modulation side band, an output light of a first semiconductor laser is injected in one way into a second semiconductor laser having an oscillation frequency adjacent to that of the first semiconductor laser through a first one-way optical injection means to generate a modulation side band, and the output light of the second semiconductor laser is further injected in one way into a third semiconductor laser having an oscillation frequency adjacent to that of the second semiconductor laser through a second one-way optical injection means to generate a modulation side band for an injection locking. Therefore, however the number of the semiconductor laser light source increases and however narrow a wavelength interval becomes, the oscillation wavelengths of all light sources are stabilized only with the wavelength control of the two semiconductor laser light sources.

What we claim is:

1. A wavelength multiplexing light source comprising:
    at least first, second, and third semiconductor lasers of a single longitudinal mode and having respective oscillation frequencies mutually outside of a pull-in range,
    a first one-way optical injection means for performing a one-way injection of an output light of the first semiconductor laser into the second semiconductor laser, having an oscillation frequency adjacent to that of the first semiconductor laser, to generate a modulation side band, and
    a second one-way optical injection means for performing a one-way injection of an output light of the second semiconductor laser into the third semiconductor laser, having an oscillation frequency adjacent to that of the second semiconductor laser, to generate a modulation side band for injection locking.

2. A wavelength multiplexing light source as claimed in claim 1, wherein the firs and the second semiconductor lasers are provided with respective wavelength controllers each thereof fixing an interval of the respective oscillation frequency.

3. A wavelength multiplexing light source as claimed in claim 1 wherein the first and the second semiconductor lasers are respectively provided with a wavelength controller in order to fix an interval of both of the oscillation frequencies and means for narrowing a line width of each of the output lights.

4. A wavelength multiplexing light source as claimed in claim 1, wherein each of the first and the second one-way optical injection means comprises a beam sputter and an optical isolator provided on an output end facet of the respective semiconductor laser.

5. A wavelength multiplexing light source as claimed in claim 1, wherein the first and the second semiconductor lasers are provided with respective wavelength controllers, each thereof fixing an interval of the respective oscillation frequency and means for widening a line width of the respective output light.

6. A wavelength multiplexing light source as claimed in claim 1, wherein the first one-way optical injection means comprises an optical isolator and the second one-way optical injection means comprises an optical circulator injecting only a light which has passed the optical isolator into the second semiconductor laser and injecting an output light of a semiconductor laser in a latter stage of the second semiconductor laser into only a subsequent semiconductor laser.

7. A wavelength multiplexing light source as claimed in claim 1, wherein each of the first and the second one-way optical injection means respectively comprises an optical isolator and an optical coupler.

8. A wavelength multiplexing light source as claimed in caim 1, wherein the first one-way optical injection means comprises an optical isolator and the second one-way optical injection means comprises an optical circulator and a fiber grating in order that oscillation spectrum components previously generated in a semiconductor laser in a prior stage are not injected into a semiconductor laser in a latter stage.

9. A wavelength multiplexing light source as claimed in claim 1, wherein the first one-way optical injection means comprises an optical isolator and the second one-way optical injection means comprises an optical circulator and an optical band-pass filter in order tha oscillation spectrum components generated previously in a semiconductor laser in a prior stage are not injected into a semiconductor laser in a latter stage.

10. A wavelength multiplexing light source as claimed in claim 1, wherein an oscillation wavelength of the first semiconductor laser comprises a shortest wavelength or a longest wavelength, and semiconductor lasers except the first semiconductor laser are connected in cascade.

11. A wavelength multiplexing light source as claimed in claim 1, wherein on longer ans shorter wavelength sides relatively to an oscillation wavelength of the first semiconductor laser, semiconductor lasers except the first semiconductor laser are connected in cascade.

12. A wavelength multiplexing light source as claimed in claim 1, further comprising means for receiving a beat signal component between side band components externally injected and oscillation components of the semiconductor lasers in order that the oscillation wavelength of each of the semiconductor lasers do not pull out a desired wavelength, and for feeding the beat signal back to the semiconductor lasers.

13. A wavelength multiplexing light source as claimed in claim 1, further comprising a band-pass filter for a fixed frequency allotted on an output end face of each of the semiconductor lasers.

14. A wavelength multiplexing light source as claimed in claim 2, wherein each of the first and the second semiconductor lasers comprises a x.14 shifted DFB semiconductor laser.

15. A wavelength multiplexing light source as claimed in claim 3, wherein the narrowing means comprises a respective mirror provided at a monitor end facet of each of the semiconductor lasers.

16. A wavelength multiplexing light source as claimed in claim 5, wherein the widening means comprises a circuit which modulates respective injection currents of the first and the second semiconductor lasers.

17. A wavelength multiplexing light source as claime din claim 5, wherein the widening line width means comprises a circuit which modulates respective temperatures of the semiconductor lasers.

\* \* \* \* \*

UNITED STATES PATENT AND TRADEMARK OFFICE
CERTIFICATE OF CORRECTION

PATENT NO. : 6,282,214 B1  
DATED : August 28, 2001  
INVENTOR(S) : Ryosuke Goto et al.

Page 1 of 1

It is certified that error appears in the above-identified patent and that said Letters Patent is hereby corrected as shown below:

Title page, Item [57], Abstract,
Line 9, delete "o"

Column 8,
Line 67, change "firs" to -- first --.

Column 9,
Line 34, change "caim" to -- claim --.
Line 44, change "tha" to -- that --.

Column 10,
Line 10, change "ans" to -- and --.
Line 20, change "do" to -- does --.
Line 29, change "X.14" to -- $\lambda/4$ --.

Signed and Sealed this

Thirteenth Day of November, 2001

Attest:

NICHOLAS P. GODICI
*Attesting Officer*   *Acting Director of the United States Patent and Trademark Office*